United States Patent
Yoo et al.

(10) Patent No.: US 7,407,856 B2
(45) Date of Patent: Aug. 5, 2008

(54) METHOD OF MANUFACTURING A MEMORY DEVICE

(75) Inventors: In-kyeong Yoo, Suwon (KR); Byong-man Kim, Gunpo (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 204 days.

(21) Appl. No.: 11/296,510

(22) Filed: Dec. 8, 2005

(65) Prior Publication Data

US 2006/0086966 A1    Apr. 27, 2006

Related U.S. Application Data

(62) Division of application No. 10/774,456, filed on Feb. 10, 2004, now Pat. No. 6,999,346, which is a division of application No. 10/041,469, filed on Jan. 10, 2002, now Pat. No. 6,740,925.

(30) Foreign Application Priority Data

Jan. 11, 2001    (KR) .................................. 2001-1549

(51) Int. Cl.
*H01L 21/336* (2006.01)

(52) U.S. Cl. ........................ 438/257; 438/258; 438/593; 438/E21.209; 438/E21.422

(58) Field of Classification Search ......... 438/257–258, 438/593–594
See application file for complete search history.

(56) References Cited

U.S. PATENT DOCUMENTS

| 5,117,269 A | * | 5/1992 | Bellezza et al. ............. 257/315 |
| 5,831,894 A | | 11/1998 | Chang |
| 5,999,444 A | | 12/1999 | Fujiwara et al. |
| 6,150,198 A | | 11/2000 | Wen |
| 6,212,103 B1 | | 4/2001 | Ahrens et al. |
| 6,249,454 B1 | | 6/2001 | Sung et al. |
| 6,307,782 B1 | | 10/2001 | Sadd et al. |
| 6,320,784 B1 | | 11/2001 | Muralidhar et al. |
| 6,342,716 B1 | | 1/2002 | Morita et al. |
| 6,391,730 B1 | | 5/2002 | Kluth et al. |
| 6,400,610 B1 | * | 6/2002 | Sadd ..................... 365/185.29 |
| 6,470,424 B1 | | 6/2002 | Forbes |
| 6,413,819 B1 | | 7/2002 | Zafar et al. |
| 6,574,144 B2 | | 6/2003 | Forbes |

FOREIGN PATENT DOCUMENTS

WO    WO 00/08649    2/2000

* cited by examiner

*Primary Examiner*—Dung A. Le
(74) *Attorney, Agent, or Firm*—Lee & Morse, P.C.

(57) ABSTRACT

A method of manufacturing a memory device includes defining a field region and an active region in a substrate, forming a field oxide layer on the field region, forming an insulating layer on the active region, patterning the insulating layer to form first and second bit lines separated from and parallel to each other on the active region, forming a memory element for storing data in a nonvolatile state, wherein the memory element passes across the first and second bit lines, and forming a word line on the insulating layer and the memory element.

10 Claims, 12 Drawing Sheets

METHOD OF MANUFACTURING A MEMORY DEVICE

CROSS REFERENCE TO RELATED APPLICATION(S)

This is a divisional application based on application Ser. No. 10/774,456, filed Feb. 10, 2004, now U.S. Pat. 6,999,346 which in turn is a division of Ser. No. 10/041,469, filed Jan. 10, 2002, U.S. Pat. No. 6,740,925 the entire contents of which is hereby incorporated by reference.

BACKGROUND OF THE INVENTION

1. Field of the Invention

The present invention relates to a semiconductor memory device. More particularly, the present invention relates to a semiconductor memory device including a single transistor having functions of random access memory (RAM) and read-only memory (ROM), and methods for operating and manufacturing the same.

2. Description of the Related Art

While RAMs allow fast data access, they are volatile, meaning that they lose their contents when the power is turned off. In contrast, ROMs, which are computer memories on which data has been prerecorded, retain their contents even when the power is turned off. ROM has a data access rate that varies depending on the type of memory, but is much slower than that of RAM. For example, flash memories, which are a variation of electrically erasable programmable read-only memory (EEPROM) that can be written and read by an electrical signal, are similar to ROM in that they retain their contents even when the power is turned off. At the same time, the flash memories have characteristics similar to RAM in that they can be erased and reprogrammed. Flash memories are faster than EEPROM, but they are not as fast as RAM. Also, since flash memories can write data by injecting electric charges through tunneling, their write voltages are high and their write time is long.

To overcome the above problems, nonvolatile RAMs (NVRAMs) have been developed. To get a NVRAM, a dielectric film of a capacitor in 1T-1C dynamic RAM having an array of unit cells, each having a single transistor and a single capacitor, is replaced by a capacitor with a ferroelectric film such as PZT ($PbZr_xTi_{1-x}O_3$), and an electrode is replaced by a heat resistant metal such as platinum (Pt). However, the NVRAM has a problem in that the fabrication process is complicated because a new process recipe is used to pattern a ferroelectric material and a heat resistant metal that are hard to etch. Another problem of NVRAM is that the direction of voltage applied must be changed for data recording and writing, and it is not commercially viable due to high applied voltage. Furthermore, it is more difficult to effectively utilize space than if a flash memory is used since the NVRAM includes capacitors together with transistors.

SUMMARY OF THE INVENTION

To solve the above problems, it is a first feature of an embodiment of the present invention to provide a memory device having the advantages of both RAM and ROM, a small size, a simple construction, a low operating voltage and a simple fabrication process due to the use of a current fabrication process.

It is a second feature of an embodiment of the present invention to provide a method for operating the memory device.

It is a third feature of an embodiment of the present invention to provide a method of manufacturing the memory device.

In order to achieve the first feature, the present invention provides a memory device including a single transistor wherein the single transistor is a memory transistor having a gate including a nonvolatile memory element.

The nonvolatile memory element may be formed between a gate insulating layer and a gate conductive layer, both layers constituting the gate, and connected to first and second bit lines separated from each other.

The first and second bit lines may pass below or above the nonvolatile memory element.

The nonvolatile memory element preferably includes semiconductor quantum dots formed on the gate insulating layer and an amorphous material layer covering the plurality of semiconductor quantum dots, wherein the amorphous material layer stores carriers emitted from the semiconductor quantum dots and maintains the carriers in a nonvolatile state until the emitted carriers are recaptured into the semiconductor quantum dots.

The semiconductor quantum dots are preferably silicon dots arranged at regular intervals, and the amorphous material layer, which is an amorphous dielectric layer, is preferably an amorphous silicon nitride layer or an amorphous alumina layer. Also, the amorphous dielectric layer may be replaced with an insulating layer such as a silicon oxide layer ($SiO_2$). The first and second bit lines are preferably conductive impurity layers formed from the surface of the substrate to a predetermined depth.

In another embodiment, a memory device includes a substrate, a transistor formed on the substrate, and a nonvolatile memory means formed between the transistor and the substrate. The nonvolatile memory means preferably includes an amorphous material layer formed on the substrate and semiconductor quantum dots formed on the amorphous material layer, wherein the amorphous material layer stores carriers emitted from the semiconductor quantum dots and maintains the carriers in a nonvolatile state until the emitted carriers are recaptured into the semiconductor quantum dots. Preferably, the transistor includes: first and second metal layer patterns formed on the amorphous material layer, both being separated from each other; an insulating layer formed on the amorphous material layer so as to cover the semiconductor quantum dots and the first and second metal layer; and a word line formed on the insulating layer at a position corresponding to a position where the semiconductor quantum dots are formed.

Preferably, the memory device further includes: an interlayer dielectric layer formed on the insulating layer for covering the word line; a via hole formed in the interlayer dielectric layer and the insulating layer so that the first metal pattern is exposed; and a fourth metal layer pattern formed on the interlayer dielectric layer for filling the via hole and passing across the word line.

In order to achieve the second feature of an embodiment of the present invention, the present invention provides a method for operating a memory device including a single transistor formed on a substrate, wherein the single transistor is a memory transistor having a gate with a nonvolatile memory element, and the nonvolatile memory element is connected to a bit line comprised of first and second bit lines passing across the gate. According to the method, an addressing voltage and a write voltage are applied to the gate and the bit line, respectively, to write data to the nonvolatile memory element.

First and second write voltages are preferably applied to the first and second bit lines, respectively, to store data "1"

and "0" to the nonvolatile memory element, and the first and second write voltages are the same as or different from each other. The second write voltage is preferably applied to the first bit line to store data "1", the first write voltage is preferably applied to the second bit line to store data "0", and the first and second write voltages are the same as or different from each other. A first write voltage may be applied to the second bit line to store data, and a second write voltage higher than the first write voltage may be applied to the second bit line to store different data.

The written data may be read by measuring the conductivity of the nonvolatile memory element. An addressing voltage may be applied to the gate, and then a current measuring means connected to the first bit line to measure current between the gate and the first bit line and thus measure the conductivity of the nonvolatile memory element, whereby data "1" or data "0" is read depending on the measured current.

The present invention also provides a method for operating a memory device including a substrate, a transistor formed on the substrate, the transistor having a gate, a drain connected to a bit line, and a source connected to a source of another transistor, a nonvolatile memory element formed between the gate and the substrate, and a metal line parallel to a word line connected to the transistor. According to the method, data is written by changing the conductivity of the nonvolatile memory element when the metal line is grounded. The nonvolatile memory element may be comprised of a material layer for storing carriers and semiconductor quantum dots formed thereon.

A write voltage and an addressing voltage may be applied to the bit line and the word line, respectively, when the metal line is grounded, to write data by changing the conductivity of the carrier storing material layer. Data may be written by changing the addressing voltage while the write voltage remains constant or by changing the write voltage while the addressing voltage remains constant.

In this case, the written data may be read by measuring the conductivity of the nonvolatile memory element. Preferably, a read voltage is applied to the bit line, and then a current measuring means is connected to the metal line to measure current between the bit line and the metal line and thus the conductivity of the nonvolatile memory element.

Different first or second read voltages may be applied to the bit line to measure current between the bit line and the metal line and thus read data. A read voltage and an addressing voltage may be applied to the metal line and the word line, respectively, and then a current measuring means may be connected to the bit line to measure current between the metal line and the bit line and thus the conductivity of the nonvolatile memory element.

In order to achieve the third feature of an embodiment of the present invention, the present invention provides a method of manufacturing a memory device. The manufacturing method includes: defining a field region and an active region in a substrate; forming a field oxide layer on the field region; forming an insulating layer on the active region; patterning the insulating layer to form first and second bit lines separated from and parallel to each other on the active region; forming a memory element for storing data in a nonvolatile state on the insulating layer and the first and second bit lines so that the memory element passes across the first and second bit lines; and forming a word line on the insulating layer and the memory element.

Preferably, the step of forming the memory element further includes: forming a plurality of spaced semiconductor quantum layers on the insulating layer and the first and second bit lines, and forming an amorphous material layer covering the semiconductor quantum dots on the insulating layer. The step of forming the memory element preferably includes the steps of forming an amorphous material layer on the insulating layer and the first and second bit lines, and forming spaced semiconductor quantum dots on the amorphous material layer.

The amorphous material layer may be an amorphous dielectric layer, and the amorphous dielectric layer may be an amorphous silicon nitride layer, an amorphous alumina layer or a silicon oxide layer ($SiO_2$).

In another embodiment of the present invention, a method of manufacturing a memory device includes: forming a nonvolatile amorphous material layer on a substrate; and forming a transistor on the nonvolatile amorphous material layer so that semiconductor quantum dots for emitting carriers to the amorphous material layer or recapturing the emitted carriers by application of a voltage are formed between the transistor and the amorphous material layer.

The step of forming the transistor preferably comprises: forming first and second metal layer patterns on the nonvolatile amorphous material layer; forming semiconductor quantum dots on the nonvolatile amorphous material layer between the first and second metal layer patterns; forming a gate insulating layer covering the resultant in which the semiconductor quantum dots are formed on the substrate; and forming a word line corresponding to the semiconductor quantum dots on the gate insulating layer.

The manufacturing method may further include: forming an interlayer dielectric layer covering the word line on the gate insulating layer; forming a via hole for exposing the first metal layer pattern; and forming a fourth metal layer pattern for filling the via hole and passing across the word line on the interlayer dielectric layer.

Accordingly, the present invention provides a memory device having advantages of RAM and ROM and a low operating voltage. Furthermore, the memory device is comprised of a single transistor, thus reducing the overall size of the device. The memory device is manufactured by a current CMOS fabrication process, thereby simplifying the fabrication process.

BRIEF DESCRIPTION OF THE DRAWINGS

The above features and advantages of the present invention will become more apparent by describing in detail preferred embodiments thereof with reference to the attached drawings in which.

DETAILED DESCRIPTION OF THE PREFERRED EMBODIMENTS

Figure 1:
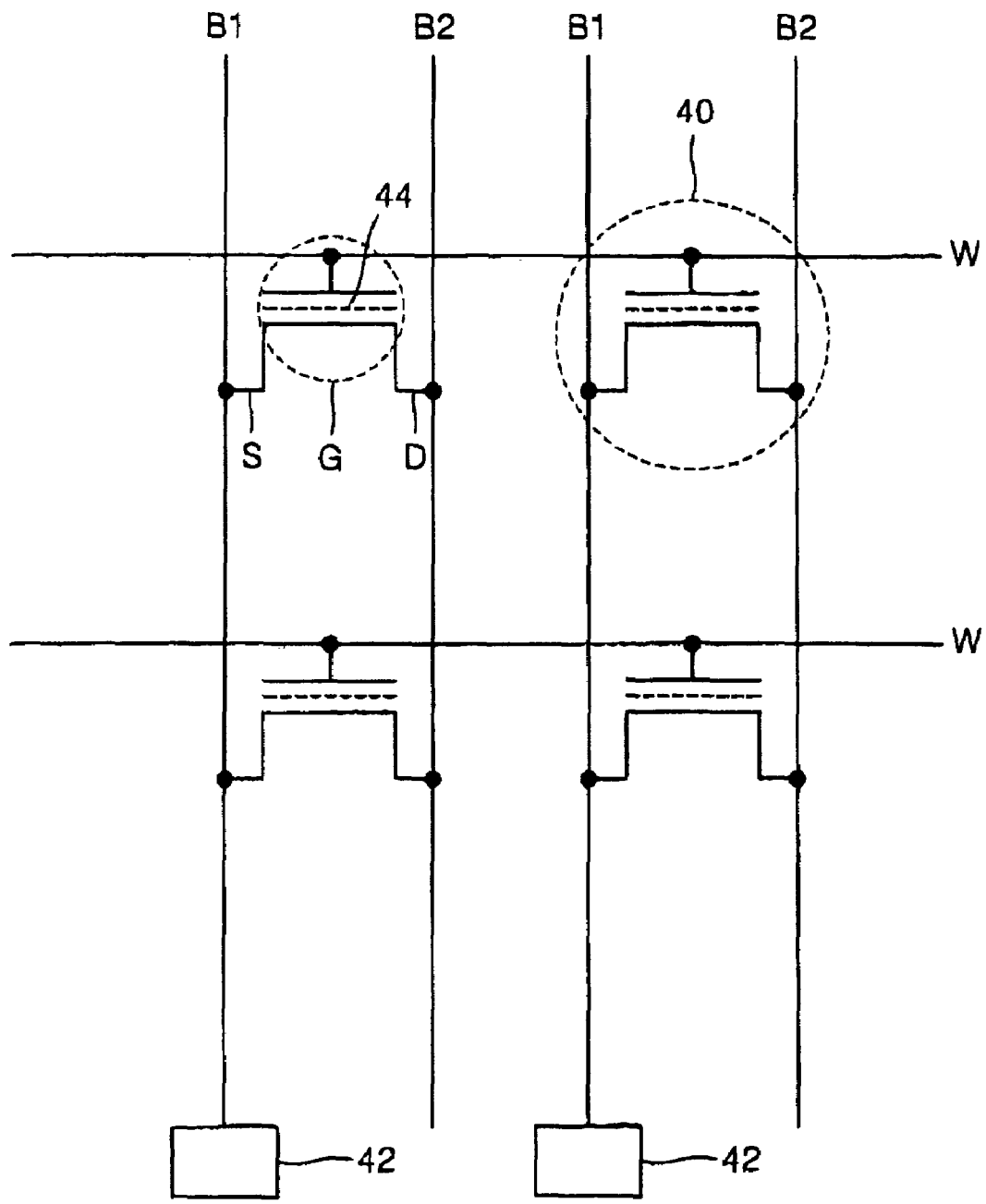
FIG. 1 illustrates an equivalent circuit diagram of a memory device including a single transistor having functions of RAM and ROM according to a first embodiment of the present invention.

Korean Patent Application No. 2001-1549, filed on Jan. 11, 2001, and entitled: "Memory Device Comprising Single Transistor Having Functions of RAM and ROM and Methods for Operating and Manufacturing the Same," is incorporated by reference herein in its entirety.

In the drawings, the thickness of layers and regions are exaggerated for clarity. First, a memory device according to a first embodiment of the present invention will be described.

In FIG. 1, which illustrates an equivalent circuit diagram of a cell array within a semiconductor chip including a memory transistor according to an embodiment of the present invention, reference numeral 40 denotes a single memory transistor having functions of RAM and ROM. Reference characters B1 and B2 denote first and second bit lines B1 and B2 respectively connected to a source S and a drain D of the memory transistor 40, and W denotes a word line connected to a gate G thereof. The cell array includes a plurality of memory transistors 40 arranged in rows and columns, and word lines corresponding to the number of rows of the memory transistors 40 and bit lines corresponding to double the number of columns of the memory transistors 40. An element 42 for measuring current across the bit lines is connected to the first bit line B1 of each of the memory transistors 40. The current measuring element 42 is preferably a sense amplifier or may be any other current measuring unit. A quantum dot 44 (or a quantum layer), which determines nonvolatility of the memory transistor 40, is formed at the gate G of the memory transistor 40.

Figure 2:
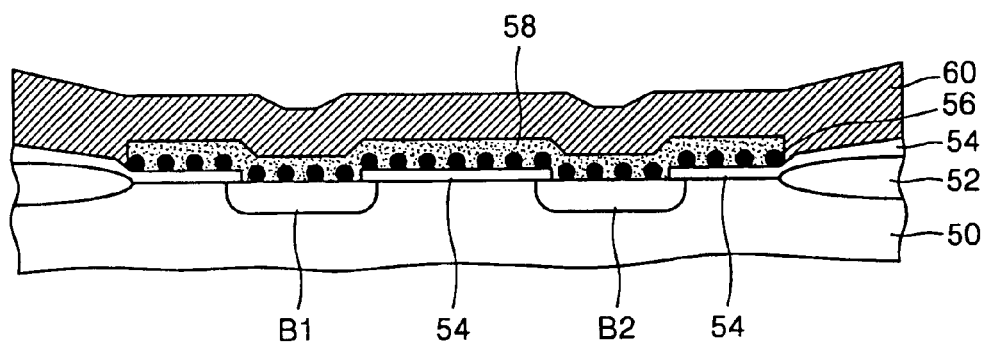
FIG. 2 illustrates a cross-section taken along a direction perpendicular to the bit line of the memory device of FIG. 1, including a single transistor having functions of RAM and ROM.

Referring to FIG. 2, which illustrates a cross-section of the memory transistor 40 taken along the word line perpendicular to the bit line, the internal configuration of the memory transistor 40 will now be described.

More specifically, a field oxide layer 52 is formed on a substrate 50. The memory transistor 40 is provided on an active region between the field oxide layers 52 together with the first and second bit lines B1 and B2. The first and second bit lines B1 and B2, which are conductive impurity layers formed to a predetermined depth, are separated from each other by a predetermined distance. An insulating layer 54 is provided on the substrate 50 between one of the first and second bit lines B1 and B2 and between the other one of the first and second bit lines B1 and B2. The insulating layer 54 is preferably a silicon oxide ($SiO_2$) layer, but it may be a layer of another material. A plurality of semiconductor quantum dots (or quantum layers) 56 are arranged at regular intervals on the first and second bit lines B1 and B2 and the insulating layer 54. The semiconductor quantum dots 56 are, for example, silicon dots (silicon particles). The semiconductor quantum dots 56 emit carriers such as electrons, or recapture emitted electrons by application of a voltage. A carrier storing material layer 58 for covering the plurality of semiconductor quantum dots 56 is provided on the insulating layer 54 between the field oxide layers 52 and on the first and second bit lines B1 and B2. The carrier storing material layer 58 stores carriers emitted from the semiconductor quantum dots 56 due to an applied voltage while keeping the carriers in a nonvolatile state until the emitted carriers are recaptured into the semiconductor quantum dots 56. Due to these properties, the carrier storing material layer 58 is called an amorphous material layer. The amorphous material layer 58 may be replaced with an insulating layer. The semiconductor quantum dots 56 and the amorphous material layer 58 are memory elements included in the gate (G of FIG. 1) of the memory transistor 40. The amorphous material layer 58 is an amorphous dielectric layer. In particular, the amorphous material layer 58 is preferably an amorphous silicon nitride (SiN) layer, or other amorphous material layer having carrier storing properties such as amorphous alumina layer ($Al_2O_3$) or a silicon oxide layer ($SiO_2$). A word line 60 passing across the first and second bit lines B1 and B2 is provided on the amorphous material layer 58 overlying the insulating layer 54. The word line 60, which is a conductive layer such as an aluminum layer, the insulating layer 54, the semiconductor quantum dots 56, and the amorphous material layer 58 constitute the gate G.

The operation of a memory device according to a first embodiment of the present invention will now be described.

First Embodiment

Write

Figure 3:
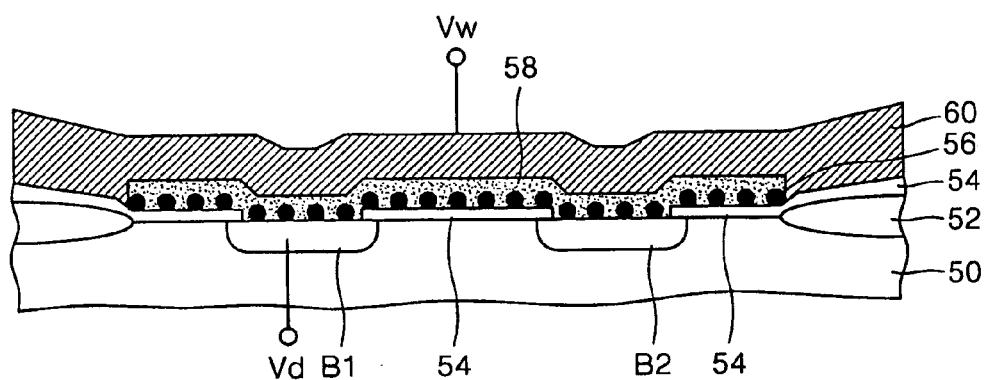
FIGS. 3 and 4 illustrate cross-sections for explaining a first embodiment of a write operation in a method for operating a memory device according to a first embodiment of the present invention.

As shown in FIG. 3, an addressing voltage Vw is applied across the word line 60, and a first write voltage Vd is applied across the first bit line B1.

The first write voltage Vd is higher than the addressing voltage Vw. A carrier (electron) stored in the amorphous material layer 58 is recaptured into the semiconductor quantum dot 56 by application of the voltages, thereby increasing the electric resistance of the amorphous material layer 58. In this case, the state of the amorphous material layer 58 refers to a state in which data "1" has been written to it.

Figure 4:
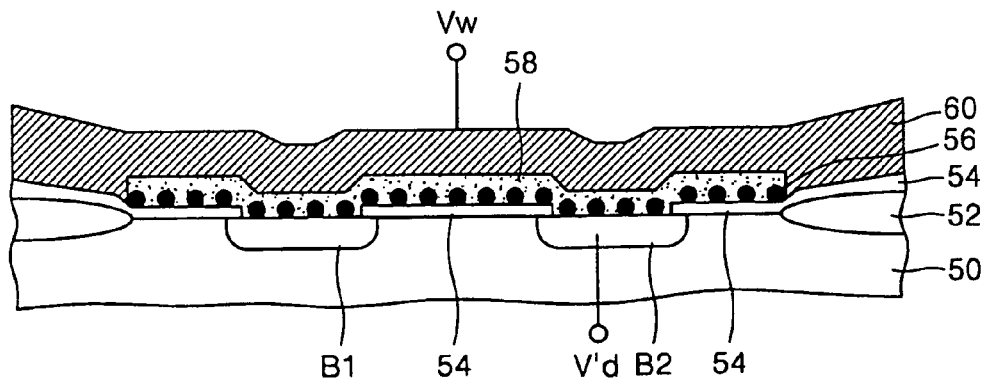

As shown in FIG. 4, in order to write data "0" to the amorphous material layer 58, an addressing voltage Vw is applied to the word line 60, and a second write voltage V'd is applied to the second bit line B2. In this case, the second write voltage V'd may be the same as or different from the first write voltage Vd. If a voltage is applied in this way, a carrier is emitted from the semiconductor quantum dot 56 to the amorphous material layer 58, thereby decreasing the electric resistance of the amorphous material layer 58.

Read

Reading data "1"

Figure 5:
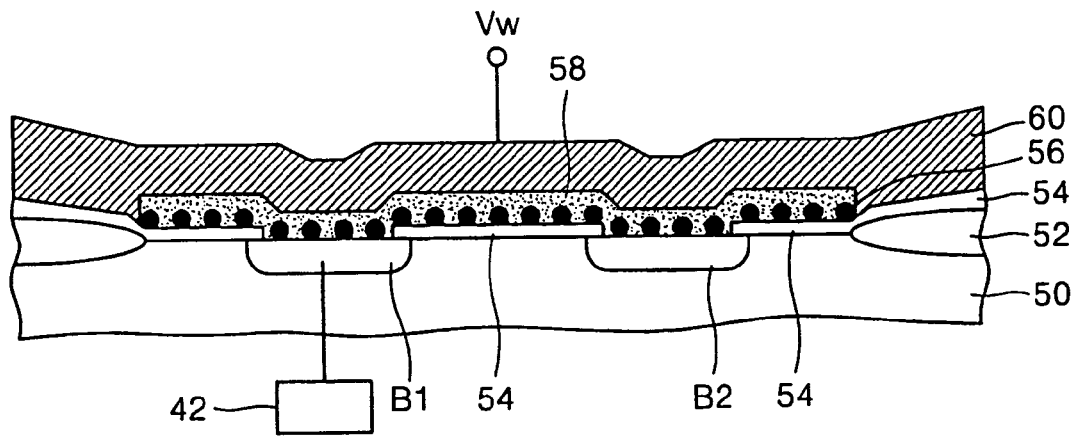
FIGS. 5 and 6 illustrate cross-sections for explaining a read operation in the method for operating a memory device according to the first embodiment of the present invention.

As shown in FIG. 5, an addressing voltage Vw is applied to the word line 60, and then the current measuring element 42 is connected to the first bit line B1 to measure current across the first bit line B1. As described above, since the resistance of the amorphous material layer 58 increases as data "1" is written to it, current flowing across the first bit line B1 decreases. Thus, it may be considered that data "1" has been read from the amorphous layer 58 when current across the first bit line B1 is small.

Reading data "0"

Figure 6:
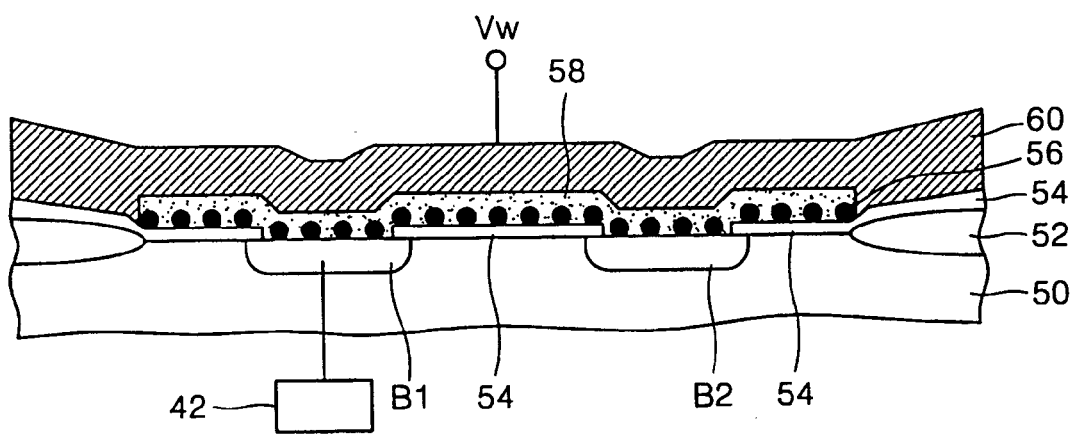

As shown in FIG. 6, after an addressing voltage Vw is applied to the word line 60, current flowing across the first bit line B1 is measured using the current measuring element 42. As described above, data "0" has been written through emitting of a carrier from the semiconductor quantum dot 56 to the amorphous material layer 58, thus making the resistance of the amorphous material layer 58 lower than that if data "1" has been written. Thus, it may be considered that data "0" has been read from the amorphous material layer 58 if current across the first bit line B1 is larger than that when the data "1" is read.

Second Embodiment

Write

Figure 7:
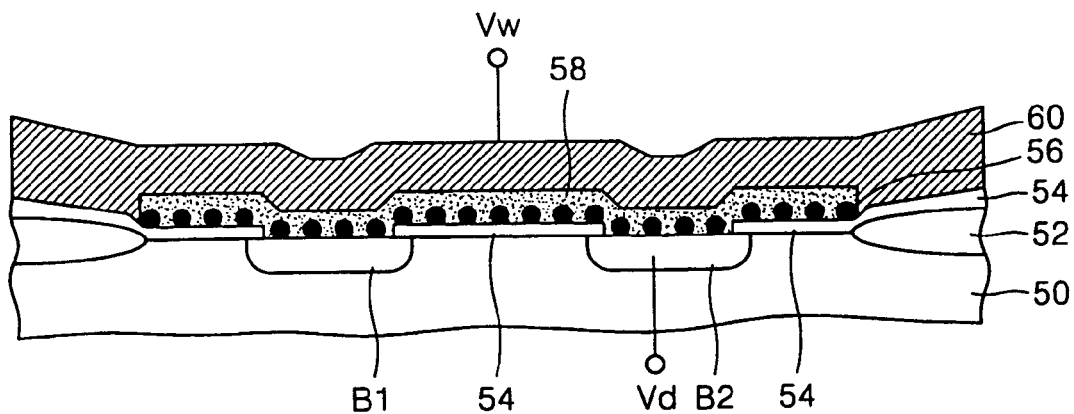
FIGS. 7 and 8 illustrate cross-sections for explaining a second embodiment of a write operation in the method for operating a memory device according to the first embodiment of the present invention.
Figure 8:
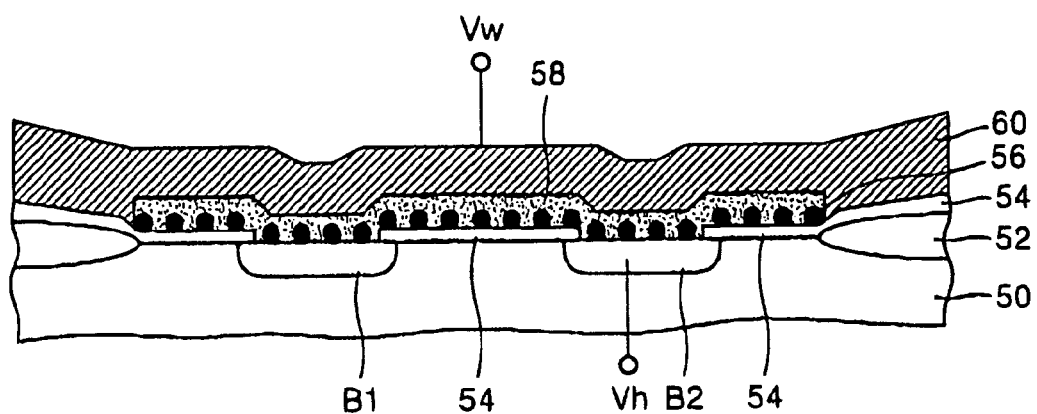

Referring to FIG. 7, an addressing voltage Vw and a first write voltage Vd are applied to the word line 60 and the second bit line B2, respectively, thereby increasing the resistance of the amorphous material layer 58. It may be considered that data "1" has been written to the amorphous material layer 58 when the resistance of the amorphous material layer 58 is increased. Referring to FIG. 8, in order to write data "0", a voltage is applied in the same manner as when data "1" is written, and a third write voltage Vh higher than the first write voltage Vd is applied to the second bit line B2, thereby making the resistance of the amorphous material layer 58 lower than if the data "1" is written.

Read

Data "1" and "0" are read in the same manner as in the first embodiment of this invention.

Figure 9:
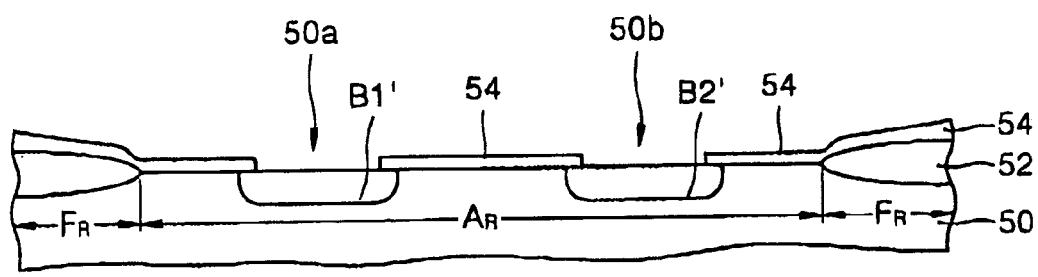
FIGS. 9-12 illustrate cross-sections taken along line A-A' of FIG. 13, showing steps of a method of fabricating a memory device according to a first embodiment of the present invention.

A method of manufacturing a memory device according to a first embodiment of the present invention will now be described. Referring to FIG. 9, an active region $A_R$ on which semiconductor devices are to be formed and a field region $F_R$ for separating the active regions $A_R$ are defined on the substrate 50. A field oxide layer 52 is formed on the field region $F_R$ and an insulating layer 54 is formed on the substrate 50. The insulating layer 54 serving as a gate insulating layer is preferably formed of silicon oxide. A part of the insulating layer 54 overlying the active region $A_R$ is removed by photolithography to expose first and second regions 50a and 50b of the substrate 50. Conductive impurities are implanted and diffused into the first and second regions 50a and 50b thereby forming first and second conductive impurity layers B1' and B2' on the first and second regions 50a and 50b. In this case, the conductive impurities are preferably implanted using ion implantation, but they may be implanted using other implantation techniques. The first and second conductive impurity layers B1' and B2' are formed to become first and second bit lines, respectively. The first and second bit lines B1 and B2 of FIG. 10 are respectively connected to a source and a drain of a memory transistor to be formed.

Figure 10:
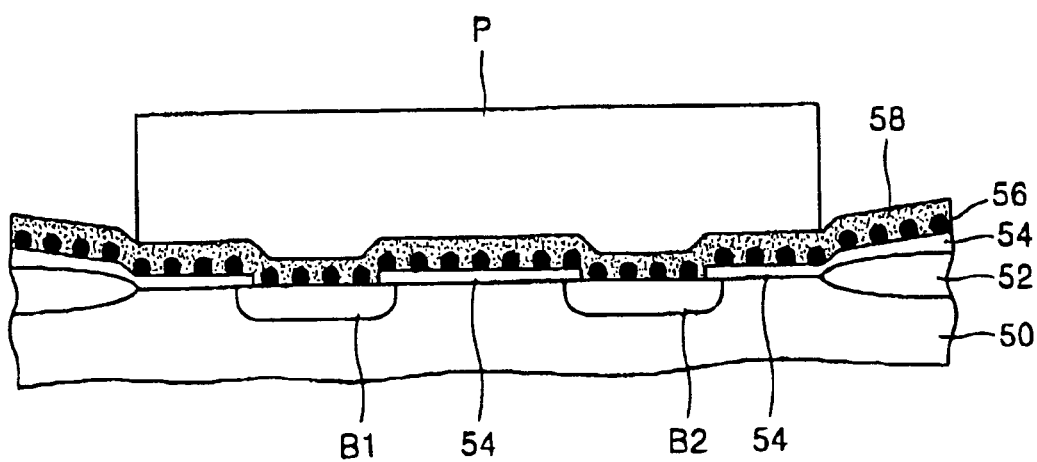

Referring to FIG. 10, a plurality of semiconductor quantum dots 56 are formed over the resulting material in which the first and second bit lines B1 and B2 have been formed. Preferably, the semiconductor quantum dots 56 are very fine, are arranged at regular intervals, and are formed of silicon. An amorphous material layer 58 covering the plurality of semiconductor quantum dots 56 is formed on the insulating layer 54. The amorphous material layer 58 stores carriers (electrons) emitted from the semiconductor quantum dots 56 by application of a voltage while maintaining the carriers in a nonvolatile state until the carriers are recaptured into the semiconductor quantum dots 56. The amorphous material layer 58 is preferably formed of a silicon nitride layer, but it may be formed of an alumina layer or a silicon oxide layer ($SiO_2$). A photoresist layer (not shown) is applied on the amorphous material layer 58, and then the photoresist layer is patterned to form a photoresist pattern P, which exposes a portion of the amorphous material layer 58 and the underlying semiconductor quantum dots 56 formed on the field oxide layer 52. The exposed portion of the amorphous material layer 58 and the underlying semiconductor quantum dots 56 are etched using the photoresist pattern P as an etch mask. The etching is performed until the insulating layer 54 is exposed. Then, the photoresist pattern P is removed by ashing and stripping.

Figure 11:
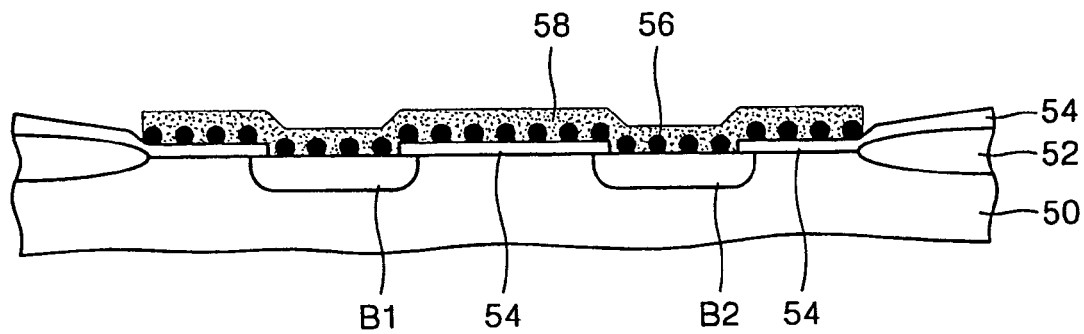

As a result, as shown in FIG. 11, the semiconductor quantum dots 56 and the amorphous material layer 58 on the field oxide layer 52 are removed thereby limiting a region on which the amorphous material layer 58 is formed to the active region between the field oxide layers 52.

Figure 12:
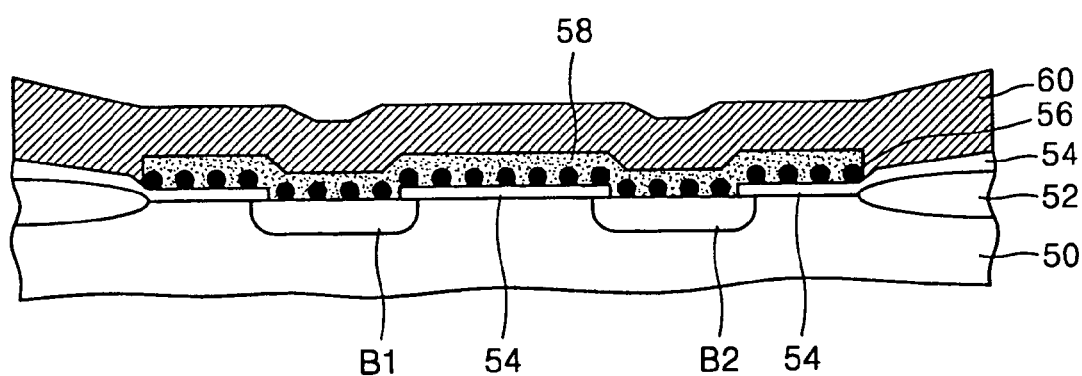

Referring to FIG. 12, a word line 60 covering the amorphous material layer 58 is formed on the insulating layer 54. The word line 60 is formed of an aluminum layer. The word line 60 is patterned in a direction in which it passes across the first and second bit lines B1 and B2, thereby forming a gate constructed of the insulating layer 54, the semiconductor quantum dots 56, the amorphous material layer 58, and the word line 60. Then, a source and a drain respectively connected to the first and second bit lines B1 and B2 are formed on either side of the gate on the substrate 50, thereby forming a memory transistor including a single transistor having advantages of both RAM and ROM.

Figure 13:
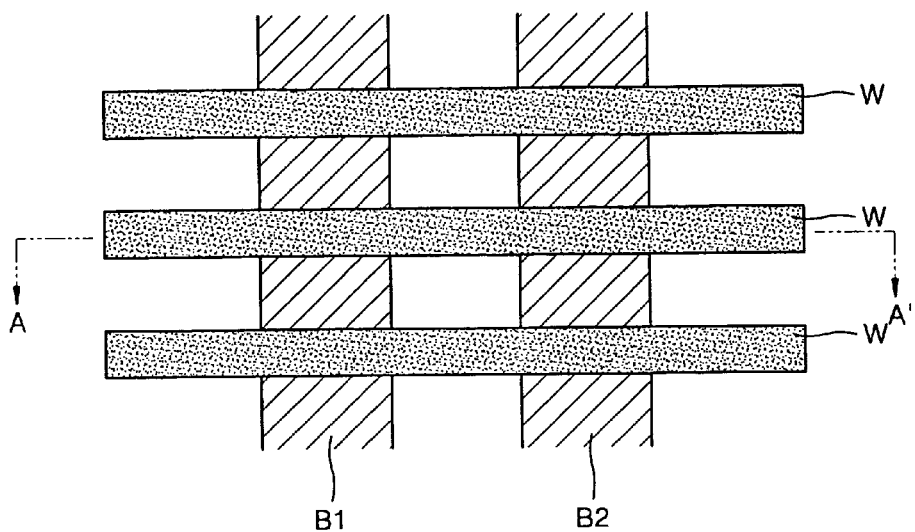
FIG. 13 illustrates a layout of a bit line and a word line of the memory device according to the first embodiment of the present invention.

FIG. 13 illustrates a layout of a cell including a memory transistor manufactured by the method described above, and FIGS. 9-12 illustrate cross-sections taken along line A'-A of FIG. 13, i.e., a direction perpendicular to the bit lines B1 and B2.

Figure 14:
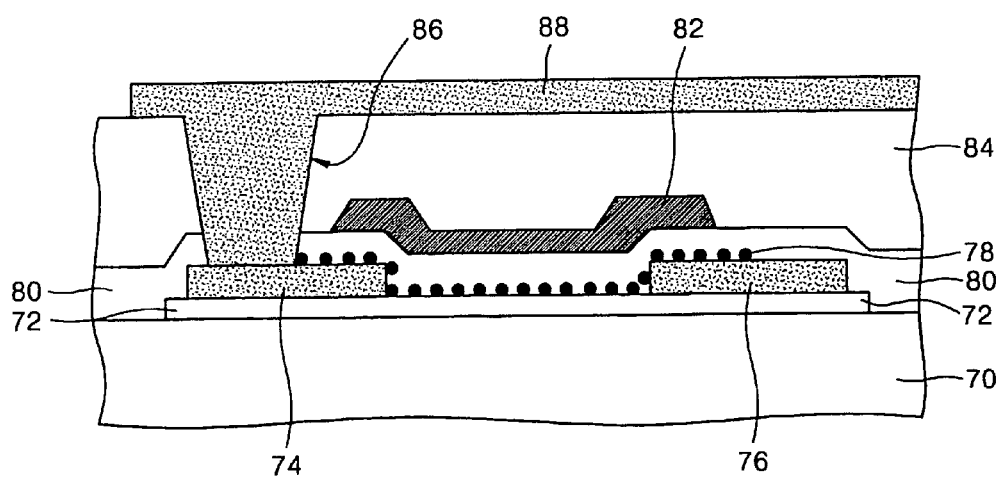
FIG. 14 illustrates a cross-section of a memory device according to a second embodiment of the present invention.

A memory device according to a second embodiment of the present invention will now be described. Referring to FIG. 14, an amorphous material layer 72 is provided on a substrate 70. The amorphous material layer 72 is the same element (58 of FIG. 2) in the memory device according to the first embodiment of the present invention. A transistor is formed on the amorphous material layer 72. More specifically, first and second metal layer patterns 74 and 76 are provided on the amorphous material layer 72, both patterns 74 and 76 being separated from each other by a predetermined distance. The first metal layer pattern 74 preferably formed of platinum (Pt) serves both as a pad conductive layer for securing a contact margin and as a drain of the transistor. The second metal layer pattern 76 also preferably formed of platinum is a source of the transistor. A plurality of semiconductor quantum dots 78 are provided on the amorphous material layer 78 between the first and second metal layer patterns 74 and 76. The semiconductor quantum dots 78 are the same element (56 of FIG. 2)

described in the first embodiment of this invention, and thus a detailed explanation thereof will be omitted. The semiconductor quantum dots 78 are also provided on opposite sides of the first and second metal layer patterns 74 and 76 and some regions thereon. The amorphous material layer 72 and the semiconductor quantum dots 78 are memory elements for storing data and maintaining the stored data in a nonvolatile state. An insulating layer 80 is provided on the resulting structure in which the semiconductor quantum dots 78 exist in order to cover the first and second metal layer patterns 74 and 76, the amorphous material layer 72, and the semiconductor quantum dots 78. The insulating layer 80 is a silicon oxide layer serving as a gate insulating layer. A word line 82 is provided on the insulating layer 80 between the first and second metal layer patterns 74 and 76. The word line 82, which is a gate conductive layer, extends onto part of the first and second metal layer patterns 74 and 76. The word line 82 is preferably formed of polysilicon. An interlayer dielectric layer 84 covering the word line 82 is formed on the insulating layer 80. The interlayer dielectric layer 84 is preferably formed of silicon oxide. A via hole 86 is formed to expose the first metal layer pattern 74. The semiconductor quantum dots 78 are exposed through one side of the via hole 86. A plate line 88 is provided for contacting the first metal layer pattern 74 and the semiconductor quantum dots 78 through the via hole 86. The plate line 88, which is preferably an aluminum pattern, is a bit line for passing across the word line 82.

Figure 15:
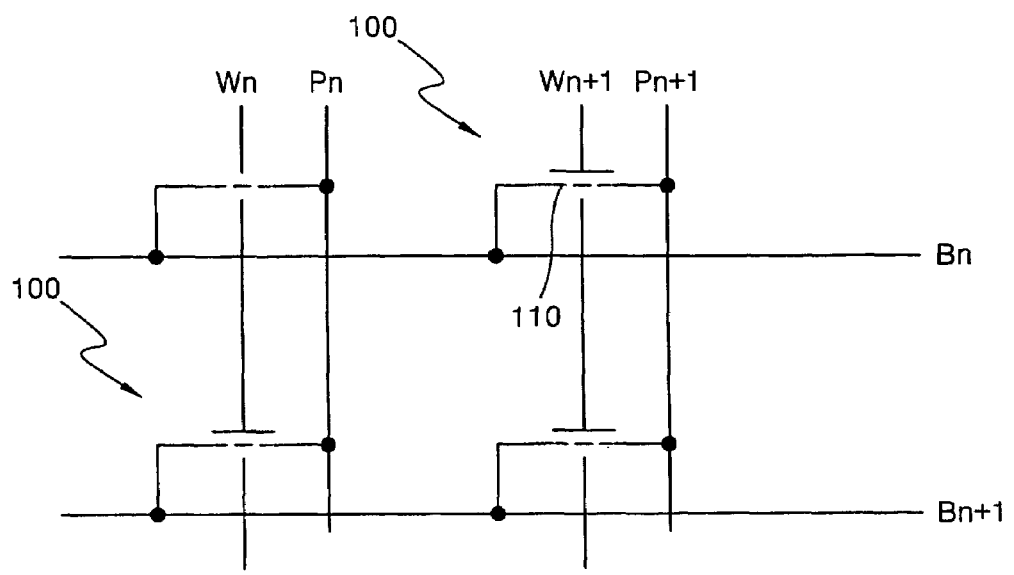
FIG. 15 illustrates an equivalent circuit diagram of the memory device according to the second embodiment of the present invention.

FIG. 15 illustrates an equivalent circuit diagram of the memory device according to the second embodiment of the present invention. In FIG. 15, reference numeral 100 denotes the memory device, i.e., the memory transistor, whose cross-section is shown in FIG. 14, $W_n$ and $W_{n+1}$ denote n-th and n+1-th word lines, respectively, and correspond to the word line 82 shown in FIG. 14. $B_n$ and $B_{n+1}$ denote n-th and n+1-th bit lines connected to drains of the memory transistors 100, respectively. $P_n$ and $P_{n+1}$ denote n-th and n+1-th common source lines, respectively, and correspond to the second metal layer pattern 76 shown in FIG. 14. Thus, the metal layer pattern 76 in FIG. 14 is a metal line connected to the source of another transistor 100 as well. The reference numeral 110 is a quantum layer composed of the amorphous material layer 72 and the semiconductor quantum dots 78, both of FIG. 14.

The operation of a memory device according to a second embodiment of the present invention will now be described.

First Embodiment

Write

Figure 16:
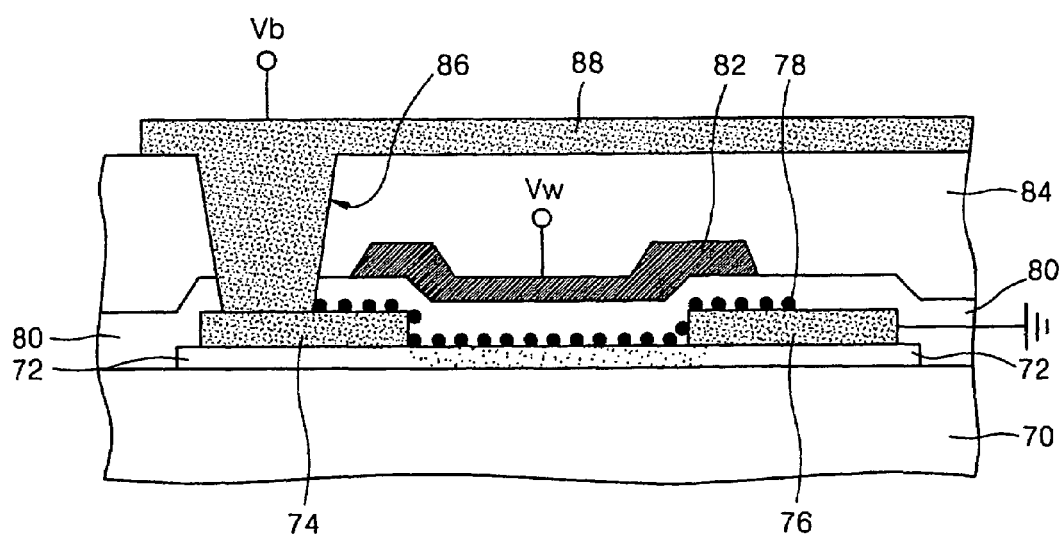
FIGS. 16 and 17 illustrate cross-sections for explaining a first embodiment of a write operation in multiple methods for operating a memory device according to a second embodiment of the present invention.

As shown in FIG. 16, a first write voltage Vb and an addressing voltage Vw are applied to a fourth metal layer pattern 88 (hereinafter called "bit line") and a third metal layer pattern 82 (hereinafter called "word line"), respectively, thereby writing data "1". In this case, the second metal layer pattern 76 (hereinafter called "common source line") is grounded.

Figure 17:
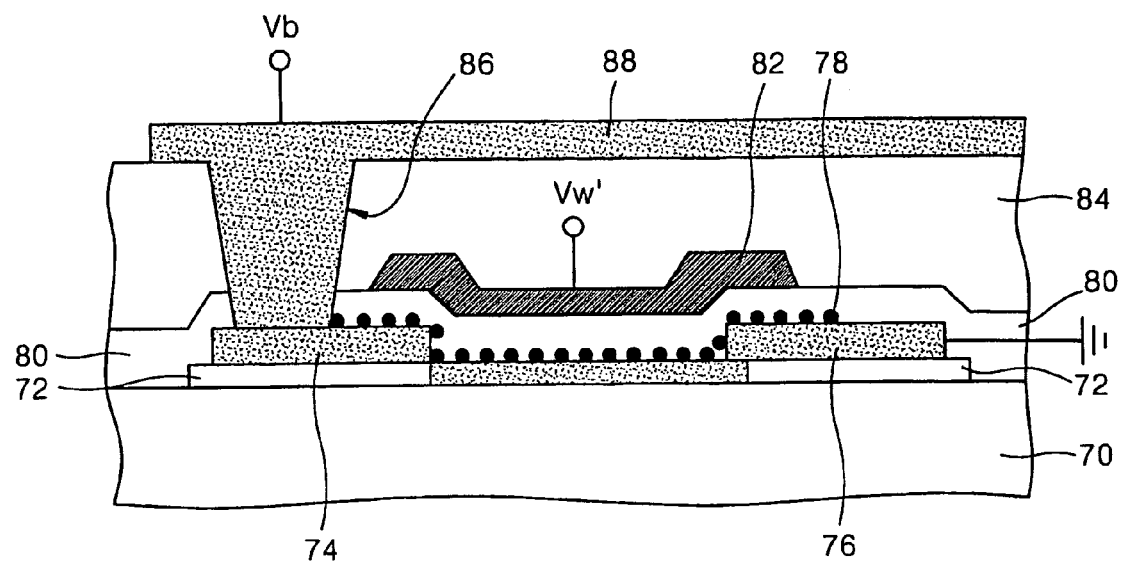

FIG. 17 shows application of a voltage when data "0" is written. Referring to FIG. 17, the first write voltage Vb and a second addressing voltage Vw' are applied to the bit line 88 and the word line 82, respectively, thereby writing data "0". In this case, the second addressing voltage Vw' is lower than the first addressing voltage Vw, and the common source line 76 is grounded.

Read

Since a charge distribution in the amorphous material layer 72 varies depending on the written data, the conductivity of the amorphous material layer 72 varies. When data is read, the conductivity of the amorphous material layer 72 is measured. Since the conductivity thereof may be measured by measuring current, a process for reading data amounts to a process for measuring current.

Figure 18:
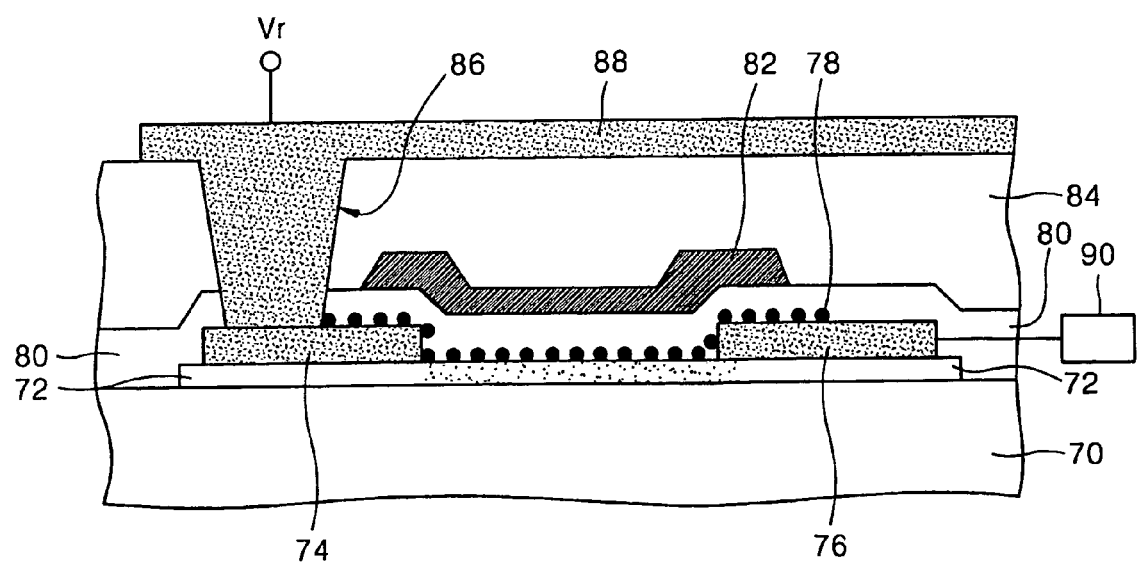
FIG. 18 illustrates a cross-section for explaining a first embodiment of a read operation, that is, an operation for reading data recorded by the first embodiment of a write operation, in the methods for operating a memory device according to the second embodiment of the present invention.

More specifically, as shown in FIG. 18, a read voltage Vr is applied to the bit line 88 to measure current between the bit line 88 and the common source line 76 using a current measuring element 90 such as a sense amplifier connected to the common source line 76. In this case, the read voltage Vr is lower than the write voltage Vb in order to prevent changes in the state of the amorphous material layer 72, i.e., the written state of data. It may be considered that data "1" has been read when the measured current is relatively small, whereas data "0" has been read when the measured current is relatively large.

Second Embodiment

Write

Figure 19:
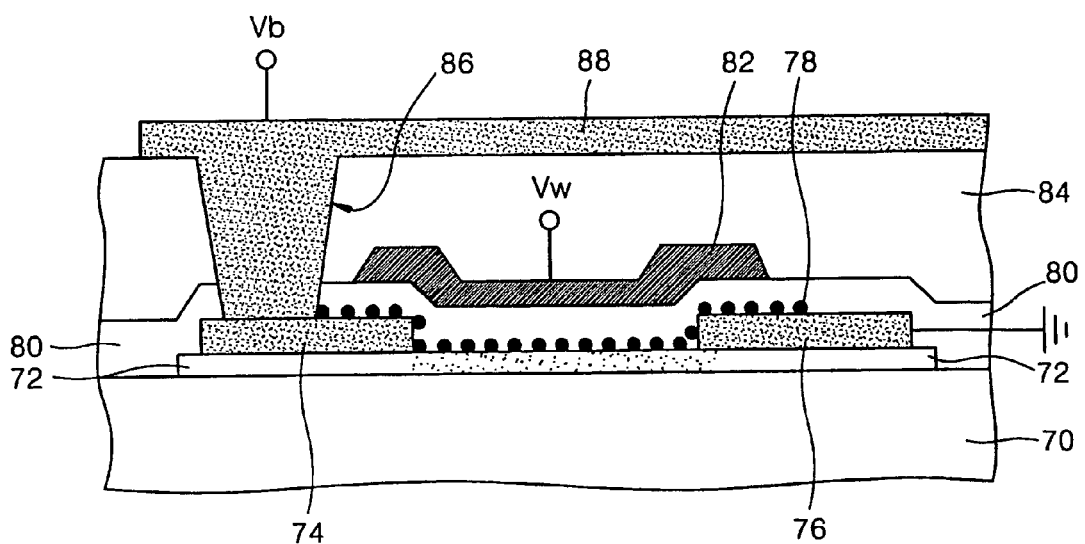
FIGS. 19 and 20 illustrate cross-sections for explaining a second embodiment of a write operation in the methods for operating a memory device according to the second embodiment of the present invention.

Unlike in the first embodiment, a write voltage applied to a bit line 88 changes depending on data to be written while an addressing voltage applied to a word line 82 is kept constant. More specifically, referring to FIG. 19, a first write voltage Vb and an addressing voltage Vw are applied to the bit line 88 and the word line 82, respectively. In the course of applying these voltages, a charge distribution in the amorphous material layer 72 varies. When the amorphous material layer 72 stays in such a state, it is considered that data "1" has been written. In this case, the common source line 76 is grounded.

Figure 20:
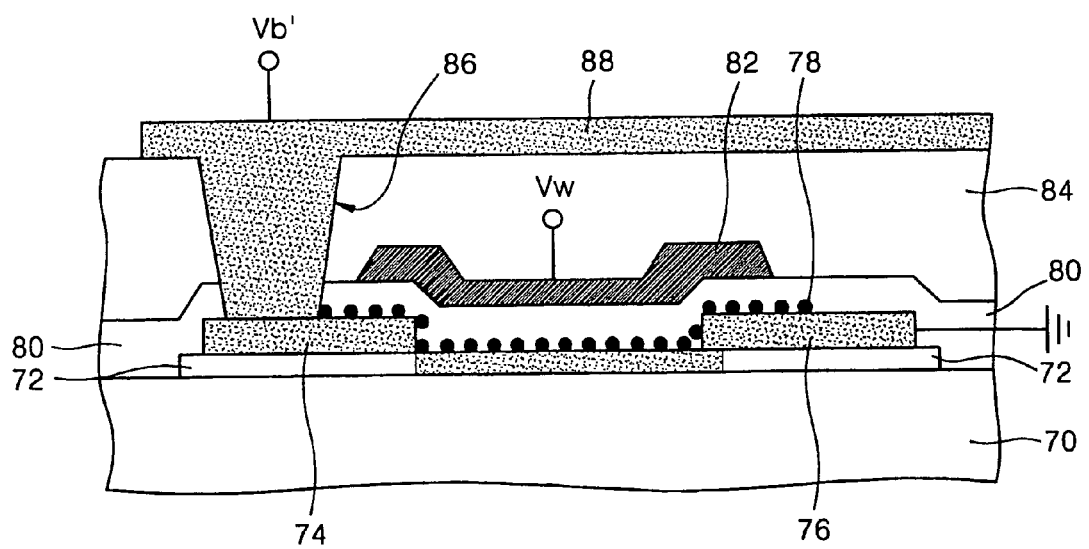

Referring to FIG. 20, a second write voltage Vb' and the addressing voltage Vw are applied to the bit line 88 and the word line 82, respectively, thus changing a charge distribution in the amorphous material layer 72. When the amorphous layer 72 is in this state, it is considered that data "0" has been written. In this case, the common source line 76 is grounded.

Read

Figure 21:
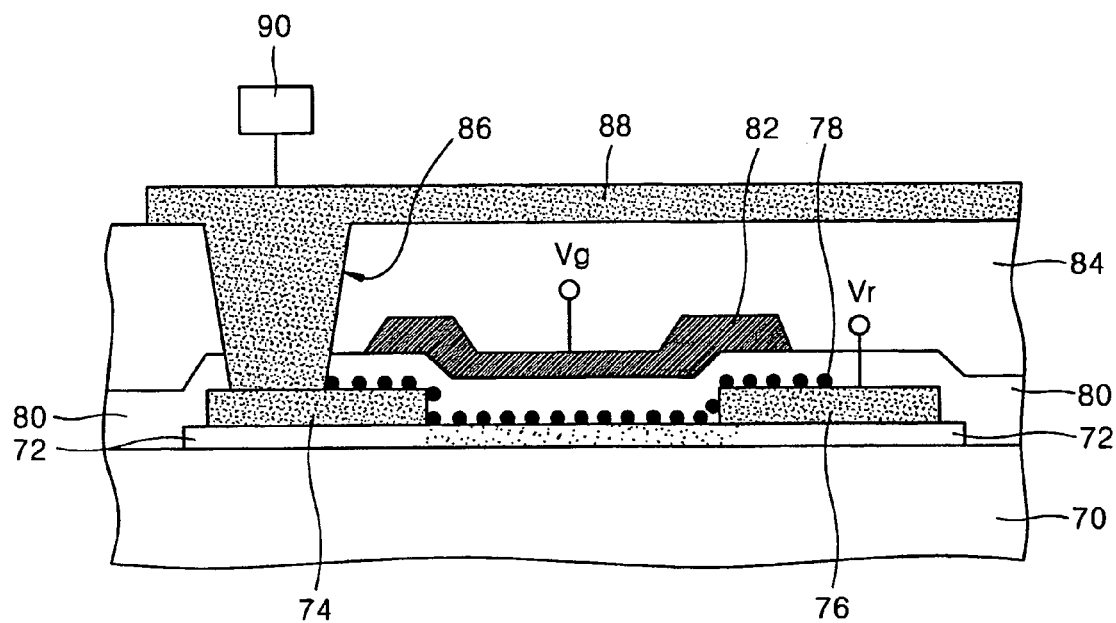
FIG. 21 illustrates a cross-section for explaining a second embodiment of a read operation, that is, an operation for reading data recorded by the second embodiment of a write operation, in the methods for operating a memory device according to the second embodiment of the present invention.

As described above, the conductivity of the amorphous material layer 72, which varies during write operation, is measured to read data. However, voltages are applied in a different way from the first embodiment of this invention. More specifically, referring to FIG. 21, the current measuring element 90 such as a sense amplifier is connected to the bit line 88. A predetermined voltage Vg is applied to the word line 82 to address the voltage Vg. Furthermore, a read voltage Vr is applied to the common source line 76 to measure current between the bit line 88 and the common source line 76. In this case, the read voltage Vr is lower than the first and second write voltages Vb and Vb' of FIGS. 19 and 20 in order to prevent data from being volatilized. It is considered that data "1" or"0" has been read depending on current measured in this way. For example, it is considered that data "0" has been read when the measured current is large while data "1" has been read when the measured current is small.

Figure 22:
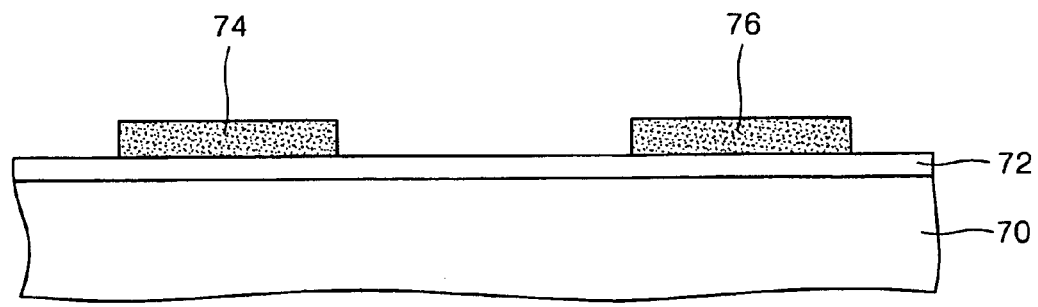
FIGS. 22-26 illustrate cross-sections showing steps of a method of fabricating a memory device according to a second embodiment of the present invention.

A method of manufacturing a memory device according to a second embodiment of this invention will now be described. For the sake of convenience, a process after forming a field oxide layer will now be described. Referring to FIG. 22, an amorphous material layer 72 is formed on an active region on a substrate 70. The amorphous material layer 72, which is a material layer serving as a memory for storing data, is preferably formed of silicon nitride. A metal layer (not shown) is formed on the amorphous material layer 72. The metal layer is preferably formed of platinum or other materials having characteristics similar to platinum. The metal layer is patterned by photolithography to form first and second metal layer patterns 74 and 76 separated from each other by a predetermined distance. The first metal layer pattern 74, which is a drain, is appropriately formed so as to secure the contact margin of a bit line. The second metal layer pattern 76, which is a common source line corresponding to either $P_n$ or $P_{n+1}$ as shown in FIG. 15, is formed in a line shape so as to connect it to sources of a plurality of transistors.

Figure 23:
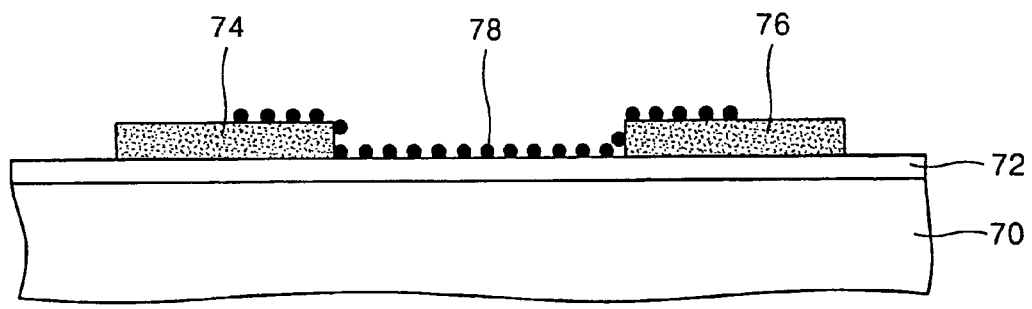

Continuing, as shown in FIG. 23, a plurality of semiconductor quantum dots 78 are selectively formed on the resulting material in which the first and second metal layer patterns 74 and 76 have been formed. For example, the plurality of semiconductor quantum dots 78 are formed over the resulting material in which the first and second metal layer patterns 74 and 76 have been formed. A photoresist pattern (not shown) is formed to cover the semiconductor quantum dots 78 formed on the amorphous material layer 72 between the first and second metal layer patterns 74 and 76 and the semiconductor quantum dots 78 formed on some regions of the first and second metal layer patterns 74 and 76 while exposing the semiconductor quantum dots 78 formed on the remaining parts. The exposed semiconductor quantum dots 78 are removed using the photoresist pattern as an etch mask, and then the photoresist pattern is removed. In this way, a quantum layer consisting of the amorphous layer 72 and the semiconductor quantum dots 78 is formed.

Figure 24:
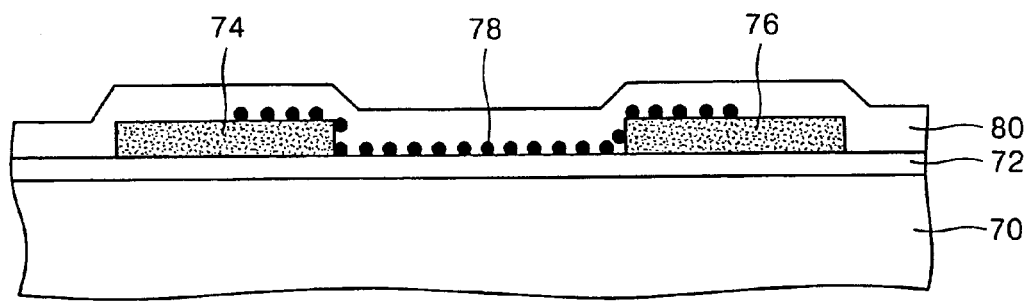

Referring to FIG. 24, an insulating layer 80 covering the semiconductor quantum dots 78 and the first and second metal layer patterns 74 and 76 is formed on the resulting material in which the semiconductor quantum dots 78 have been selectively formed. The insulating layer 80 is preferably formed to a predetermined thickness such that it may serve as a gate insulating layer, and it may be formed of a material layer such as a silicon oxide layer appropriate for the gate insulating layer.

Figure 25:
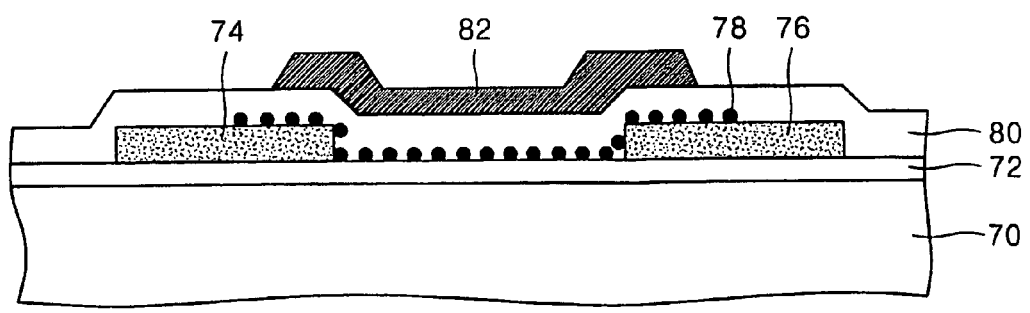

Referring to FIG. 25, word line 82 is formed on a region between the first and second metal layer patterns 74 and 76 and extends onto part of the first and second metal layer patterns 74 and 76. Since the word line 82 is connected to a gate of another transistor as well, it is formed in a line shape and preferably formed of polysilicon. Also, the word line 82 may be formed of a silicide layer such as a tungsten silicide layer or other material layer, or a multilayer to reduce an electrical resistance. In this way, a memory transistor having functions of both RAM and ROM is completed.

Figure 26:
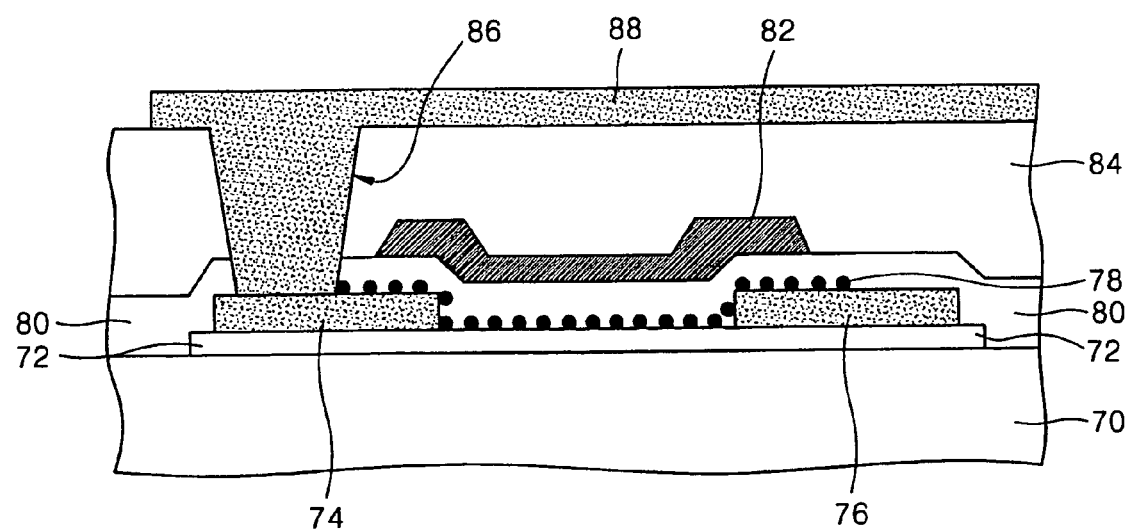

Continuing, referring to FIG. 26, an interlayer dielectric layer 84 covering the word line 82 is formed on the insulating layer 80, and then the surface thereof is planarized. The interlayer dielectric layer 84 is preferably formed of silicon oxide. In order to form a bit line contact on the interlayer dielectric layer 84, a photoresist pattern (not shown) is formed to expose a portion of the interlayer dielectric layer 84 formed on the first metal layer pattern 74. The exposed portion of the interlayer dielectric layer 84 is removed using the photoresist pattern as an etch mask. This etching is performed until part of the first metal layer pattern 74 is exposed. As a result, a via hole 86 is formed to expose part of the first metal layer pattern 74. In this case, the exposed semiconductor quantum dots 78 formed on the first metal layer pattern 74 are removed. Continuously, in order to form a bit line, after removal of the photoresist pattern, a metal layer (not shown) for filling the via hole 86 is formed on the interlayer dielectric layer 84. The metal layer is preferably formed of aluminum. A photolithography for forming a bit line is used to pattern the metal layer, thereby forming a plate line 88 used as a bit line on the interlayer dielectric layer 84.

As described above, a memory device according to the present invention may include a single transistor having a memory element (quantum layer) for storing data, thereby eliminating the need for a separate capacitor for data storage thus reducing the overall size of the memory device. As shown in FIGS. 2 and 14, a single transistor has a simple structure, which is the same as that of a transistor of RAM having no double gate, thereby allowing high speed operation and access comparable to RAM and lowering an operating voltage. Furthermore, as described above, the memory device according to the present invention including a nonvolatile memory element comprised of semiconductor quantum dots and an amorphous material layer has a function of ROM that is nonvolatile, thereby retaining data in the same state for a long period of time, but not permanently, and thus providing a power-saving CMOS memory device having a refresh cycle that is longer than that of RAM.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

For example, the memory transistor and methods for operating and manufacturing the same may be applied to a memory device comprised of a memory transistor having a different insulating layer and methods for operating and manufacturing the same. A voltage may be applied to the first or second bit line B1 or B2 through a contact plug connected to the first or second bit line B1 or B2. Furthermore, in the memory device according to the first embodiment of the present invention, the semiconductor quantum dots 56 may be formed on the amorphous material layer 58. In the memory device according to the second embodiment of the present invention, the amorphous material layer 72 may be replaced by a thin oxide layer or may be formed at the position where the insulating layer 80 is to be formed. In this case, the semiconductor quantum dots 78 may be left without changing the form of the memory device, or may be formed on the amorphous material layer 72.

What is claimed is:

1. A method of manufacturing a memory device, comprising:

defining a field region and an active region in a substrate;
   forming a field oxide layer on the field region;
   forming an insulating layer on the active region;
   patterning the insulating layer to form first and second bit lines separated from and parallel to each other on the active region;
   forming a memory element for storing data in a nonvolatile state, wherein the memory element passes across the first and second bit lines; and
   forming a word line on the insulating layer and the memory element.

2. The method of claim 1, wherein forming the memory element further comprises:

forming a plurality of spaced semiconductor quantum layers on the insulating layer and the first and second bit lines; and
   forming an amorphous material layer covering the semiconductor quantum dots on the insulating layer.

3. The method of claim 1, wherein forming the memory element comprises:

forming an amorphous material layer on the insulating layer and the first and second bit lines; and
   forming spaced semiconductor quantum dots on the amorphous material layer.

4. The method of claim 2, wherein the amorphous material layer is an amorphous dielectric layer.

5. The method of claim 4, wherein the amorphous dielectric layer is formed of an amorphous silicon nitride layer, an amorphous alumina layer or a silicon oxide layer ($SiO_2$).

6. The method of claim 3, wherein the amorphous material layer is an amorphous dielectric layer.

7. The method of claim 6, wherein the amorphous dielectric layer is formed of an amorphous silicon nitride layer, an amorphous alumina layer or a silicon oxide layer ($SiO_2$).

8. The method of claim 2, wherein the semiconductor quantum dots are silicon dots for emitting carriers to the amorphous material layer or recapturing the emitted carriers by application of a voltage.

9. The method of claim 3, wherein the semiconductor quantum dots are silicon dots for emitting carriers to the amorphous material layer or recapturing the emitted carriers by application of a voltage.

10. The method of claim 1, wherein forming the memory element includes forming the memory element on the insulating layer and the first and second bit lines.

* * * * *